US006400516B1

(12) United States Patent
Spinali

(10) Patent No.: US 6,400,516 B1
(45) Date of Patent: Jun. 4, 2002

(54) KINEMATIC OPTICAL MOUNTING

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/635,697

(22) Filed: Aug. 10, 2000

(51) Int. Cl.$^7$ ................................................ G02B 7/02
(52) U.S. Cl. ........................ 359/819; 359/818; 359/823
(58) Field of Search ................................. 359/804, 811, 359/818, 819, 822, 823, 827; 353/100

(56) References Cited

U.S. PATENT DOCUMENTS

| | | | | |
|---|---|---|---|---|
| 4,681,408 A | | 7/1987 | Ahmad et al. ............... | 359/848 |
| 4,726,671 A | | 2/1988 | Ahmad et al. ............... | 359/848 |
| 4,733,945 A | | 3/1988 | Bacich ........................ | 359/896 |
| 4,854,671 A | | 8/1989 | Hanke et al. ................ | 359/820 |
| 4,929,073 A | | 5/1990 | La Plante et al. ........... | 359/848 |
| 5,249,082 A | | 9/1993 | Newman ..................... | 359/813 |
| 5,428,482 A | * | 6/1995 | Bruning et al. ............. | 359/827 |
| 5,537,262 A | * | 7/1996 | Aoki et al. .................. | 359/822 |
| 5,986,827 A | | 11/1999 | Hale ........................... | 359/822 |
| 6,239,624 B1 | * | 5/2001 | Watson et al. ............... | 359/819 |
| 6,242,065 B1 | * | 6/2001 | Blomberg et al. .......... | 428/64.1 |

FOREIGN PATENT DOCUMENTS

JP          63-131110          6/1988

* cited by examiner

*Primary Examiner*—Georgia Epps
*Assistant Examiner*—Saeed Seyrafi
(74) *Attorney, Agent, or Firm*—Finnegan, Henderson, Farabow, Garrett & Dunner, L.L.P.

(57) ABSTRACT

An optical mounting assembly, such as a lens cell assembly, method for making a lens cell assembly, and method for supporting a lens in the lens cell assembly are provided to kinematically mount an optical element to an optical holder. The optical mounting assembly includes an optical element having a plurality of mounting pads distributed around an outer circumference of the optical element, and an optical holder having a corresponding plurality of clamping brackets distributed around an inner circumference of the optical holder. The optical holder supports or constrains movement of the optical element at points of contact between the plurality of mounting pads and the corresponding plurality of clamping brackets both in a normal direction parallel to the optical axis of the assembly and in a tangential direction of the corresponding mounting pad. When the optical element has three mounting pads and the optical holder constrains the optical element at corresponding three clamping brackets, the optical element is constrained in six degrees of freedom, three in the normal direction and another three in the tangential direction at the corresponding mounting pads. The optical mounting assembly of this invention can be used in combination with a projection lens assembly in a semiconductor wafer manufacturing process.

40 Claims, 11 Drawing Sheets

KINEMATIC OPTICAL MOUNTING

BACKGROUND OF THE INVENTION

1. Field of the Invention

This invention relates to a kinematic optical mounting to support an optical mounting. More particularly, this invention relates to a kinematic optical mounting to support a lens cell in an optical barrel such as the optical barrel used in the projection lens system for a photolithography process to manufacture semiconductor wafers, or in a photographic camera.

2. Description of the Related Art

In manufacturing integrated circuits using photolithography, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. Thus, the layer of uncovered silicon is altered to produce one layer of the multi-layered integrated circuit. Conventional systems use visible and ultraviolet light for this process.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

The projection exposure apparatus commonly includes a lens barrel to carry a plurality of lens serially aligned along an optical axis of the lens barrel. Each lens is mounted on a lens cell. The combination of a lens and a lens cell is generally referred to as the lens cell assembly. In a conventional lens cell assembly, the lens is fastened to the lens cell by chemical adhesives or friction clamping.

The conventional lens cell assembly poses several problems. In a photolithography system where an inert gas, for example nitrogen or helium, is introduced inside the projection exposure apparatus surrounding the lens cell assembly, the adhesive may release gas which could be harmful to the environment of the lens cell assembly. The released gas from adhesive absorbs the exposure light.

One problem with the conventional lens cell assembly utilizing friction clamping is that the clamping force retains or pinches the lens which often causes the lens surface to deform. Moreover, when the projection lens assembly is severely disturbed, such as when the assembly is being shipped from the manufacturer's site to a production site, the clamping force may cause the lens to break.

In light of the foregoing, there is a need for a kinematic optical mounting and method for kinematically supporting the optical element in the optical mounting assembly that can apply an appropriate amount of force to constrain movement of the optical element without unduly altering the physical and chemical properties of the optical element.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is an optical mounting assembly comprising an optical element, having an optical axis, an outer circumference, and a plurality of mounting pads distributed substantially equi-angularly around the outer circumference. The optical mounting assembly also comprises an inner circumference and an optical holder having a corresponding plurality of clamping brackets distributed around the inner circumference. The optical holder supports the optical element at points of contact between the respective mounting pads and the corresponding plurality of clamping brackets.

Another aspect of the present invention is an optical mounting assembly comprising an optical element having an optical axis, and an optical holder supporting the optical element at three points of contact distributed equi-angularly around the optical holder. The optical element is constrained by the optical holder in six degrees of freedom at the three points of contact, three degrees of freedom in a normal direction parallel to the optical axis, and another three degrees of freedom in a tangential direction of the optical holder at the corresponding three points of contact.

A further aspect of the present invention is a method for making an optical mounting assembly having an optical holder supporting an optical element. The method comprises the steps of forming a plurality of mounting pads distributed substantially equi-angularly around an outer circumference of the optical element, and supporting the plurality of mounting pads by a corresponding plurality of clamping brackets distributed around an inner circumference of the optical holder for supporting the optical element at points of contact between the plurality of mounting pads on the optical element and the corresponding plurality of clamping brackets on the optical holder.

Yet a further aspect of the present invention is a method for supporting an optical element in an optical mounting assembly. The optical mounting assembly has an optical holder for supporting the optical element and has an optical axis. The method comprises the step of providing three points of contact distributed substantially equi-angularly between an inner circumference of the optical element and an outer circumference of the optical holder. The method also comprises the steps of constraining the optical element to the optical holder in three degrees of freedom in a normal direction parallel to the optical axis at the corresponding three points of contact, and constraining the optical element to the optical holder in other three degrees of freedom in a tangential direction of the optical holder at the corresponding three points of contact.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to an embodiment of assembly and method consistent with the principles of the present invention, examples of which are illustrated in the accompanying drawings. The invention will be further clarified by the following examples, which are intended to be exemplary of the invention.

An optical mounting assembly, such as a lens cell assembly, consistent with the principles of this invention is useful to kinematically mount an optical element, such as a lens or a mirror, to an optical holder, such as a lens cell or a mirror frame. One application of this invention is use in a photolithography system to manufacture semiconductor devices. Kinematic mounting in this application means that the lens or mirror is fully supported and precisely constrained by the lens cell or mirror frame in all six degrees of freedom. For practical purposes, the invention will be described with respect to a lens and a lens cell. However, this invention is not limited to that particular application. Rather, the assembly and method disclosed herein could be used in any assembly configured to embody similar elements that require kinematic mounting.

The optical mounting assembly according to this invention is particularly applicable in situations where a kinematic mounting is needed to support an optical element that will induce minimal distortion to the optical element, does not use any chemical adhesives, and does not rely on friction to maintain the position of the optical element. In addition, the optical mounting assembly according to this invention can be repeatedly disassembled or reassembled with no major adjustment necessary to obtain accurate alignment.

Figure 1:
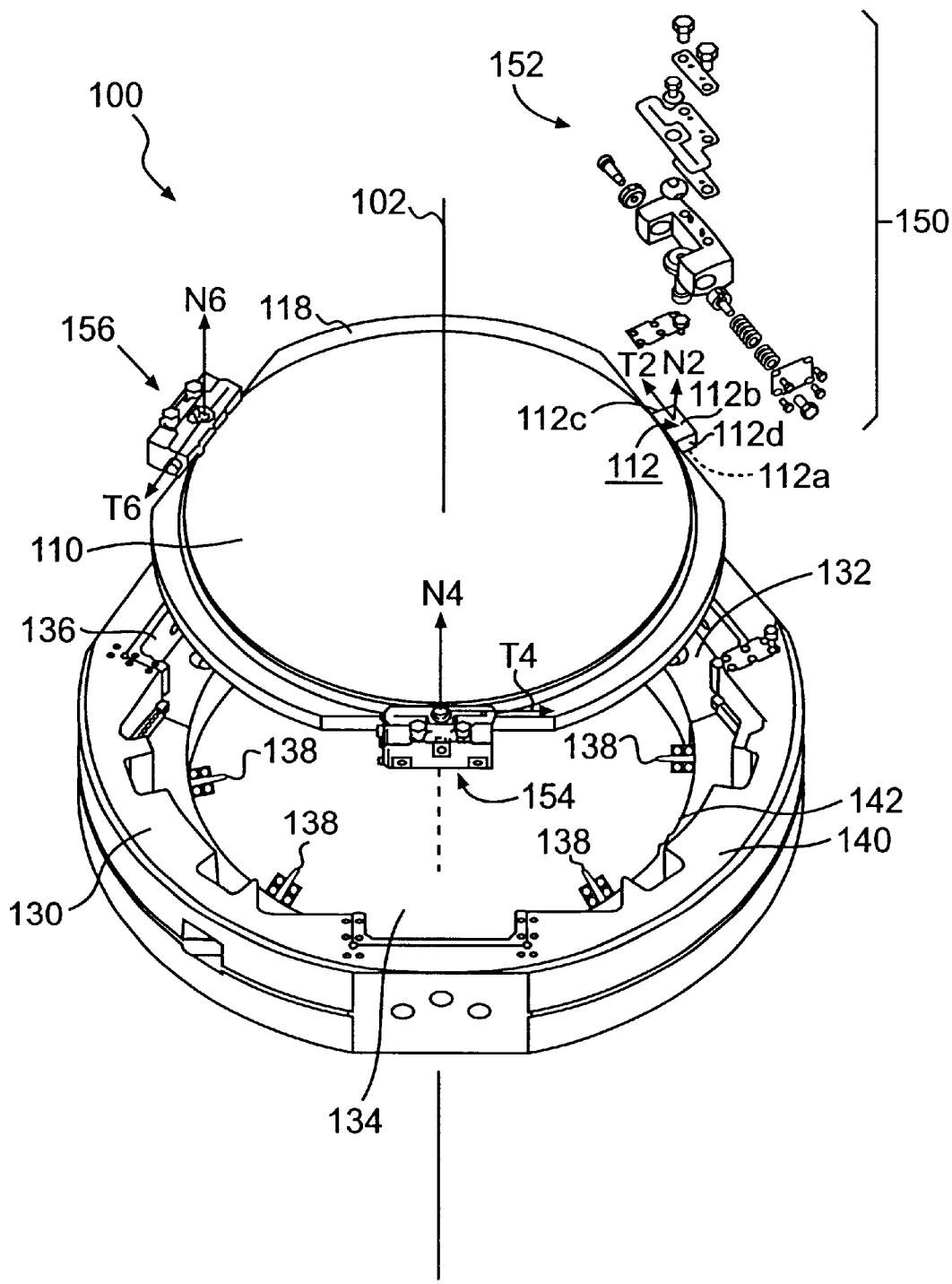
FIG. 1 is a partially exploded perspective view of the optical mounting assembly consistent with the principles of the present invention.

Consistent with the principles of the present invention, as illustrated in FIG. 1, a lens cell assembly 100 is provided for mounting a lens 110 to a lens cell 130 using clamping brackets, collectively designated by the reference number 150. In a projection lens assembly 78 (shown in FIG. 7), a plurality of lens cell assemblies 100 are generally serially aligned along an optical axis 102 of the projection lens assembly 78.

Lens 110 includes a plurality of mounting pads distributed substantially equi-angularly around the outer circumference of lens 110. In one embodiment, a set of three mounting pads 112 are located 120° from each other. Mounting pads 112 are preferably constructed as protrusions from and made of the same material as lens 110. Each mounting pad 112 is preferably a rectangular plate projection having a first side 112a and a second side 112b in a normal direction N parallel to optical axis 102, and includes a third side 112c and a fourth side 112d in a tangential direction T at the corresponding mounting pad 112. FIG. 1 shows sides 112a, 112b, 112c, 112d, being bottom, top, rear, front surfaces, respectively.

Lens cell 130 includes a plurality of clamp seat areas distributed substantially equi-angularly around the inner circumference of lens cell 130 where a plurality of clamping brackets 150 sit. In the said embodiment, a corresponding set of three clamp seat areas 132, 134, and 136 is provided at 120° from each other to receive the set of three mounting pads 112, 114, and 116. Lens cell 130 may also include a plurality of retainer clips 138 distributed around the inner circumference of lens cell 130. Retainer clips 138 are fastened to an annular step 142. The plurality of retainer clips 138 are provided for distributing the gravitational load without overconstraining lens 110. Retainer clips 138 may include a set of six (four are shown in FIG. 1) cantilever blade for supporting a portion of the weight of lens 110 in the direction of optical axis 102. Retainer clips 138 are compliant in the direction of optical axis 102. Retainer clips 138 provide more distributed support of lens 110 to counter any distortion due to gravity. The set of six retainer clips are evenly spaced in three sets of two clips between each of three clamping brackets 150. Other sets of retainer clips 138 could also be utilized, such as three, nine or more, to be evenly spaced around annular step 142.

In the illustrated embodiment, a set of three clamping brackets 152, 154, and 156 is provided to constrain movements of the set of three mounting pads 112, 114, and 116. The three pairings of mounting pads 112, 114, 116 with clamping brackets 152, 154, 156, respectively, create three points of contact between lens 110 and lens cell 130. Consistent with the principles of the present invention, lens 110 is supported and constrained by lens cell 130 at the three points of contact.

Each clamping bracket 150 supports or constrains lens 110 in a normal direction N parallel to optical axis 102 and in a tangential direction T of lens 110 at the corresponding clamping bracket 150. In the embodiment shown in FIG. 1, for example, clamping bracket 152 supports or constrains mounting pad 112 of lens 110 in the normal direction $N_2$ and in the tangential direction $T_2$ of lens 110 at mounting pad 112. Likewise, clamping brackets 154 and 156 support or constrain mounting pads 114 and 116, respectively, in the normal directions $N_4$ and $N_6$, respectively, and in the tangential directions $T_4$ and $T_6$, respectively. Consistent with the principles of the present invention, clamping brackets 152, 154, and 156 support or constrain lens 110 to lens cell 130 in six degrees of freedom, three in the normal directions $N_2$, $N_4$, and $N_6$, and another three in the tangential direction $T_2$, $T_4$, and $T_6$ at the corresponding points of contact.

Figure 2A:
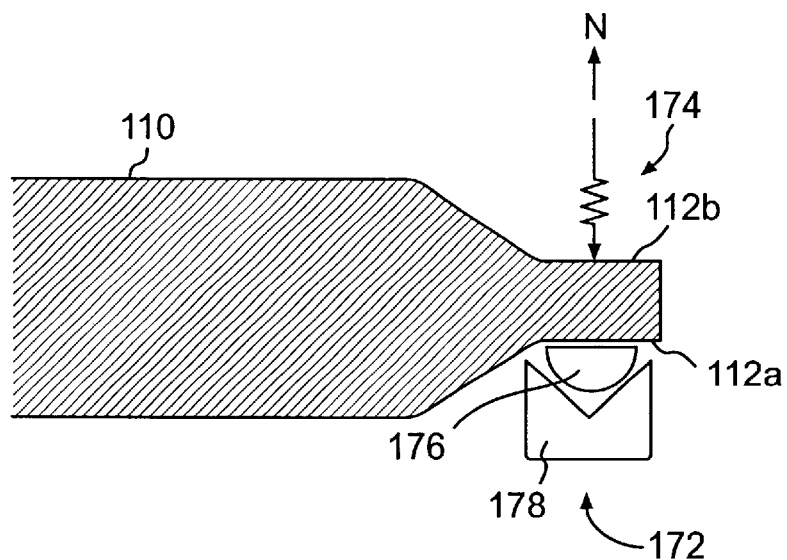
FIG. 2A is a conceptual diagram illustrating a partial section side view of a mounting pad.
Figure 2B:
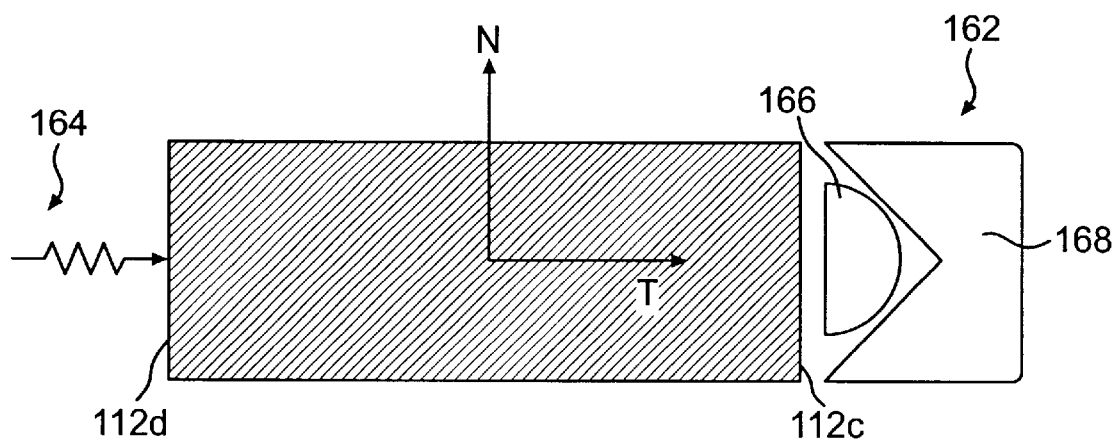
FIG. 2B is a conceptual diagram illustrating a section end view of a mounting pad.

FIGS. 2A and 2B illustrate conceptually how each mounting pad 112 is supported or constrained in normal direction N and tangential direction T. In FIG. 2A, illustrating the side view of mounting pad 112, bottom side 112a of mounting pad 112 is constrained by a fixed stopping pad 172 and top side 112b is constrained by flexible stopping pad 174 pressing top side 112b towards bottom side 112a. Likewise, in FIG. 2B, illustrating the end view of mounting pad 112, rear side 112c of mounting pad 112 is constrained by a fixed stopping pad 162 and front side 112d is constrained by a flexible stopping pad 164 pressing front side 112d towards rear side 112c.

Fixed stopping pad 162 may include a hemisphere pad 166 freely rotatable in a conical bearing 168. Thus, when flexible stopping pad 164 presses fixed stopping pad 162, a flat surface of hemisphere pad 166 can rotate within conical bearing 168 to make kinematic full contact with rear side 112c of a mounting pad 112. Similarly, fixed stopping pad 172 may include a hemisphere pad 176 freely rotatable in a conical bearing 178. Thus, when flexible stopping pad 174 presses fixed stopping pad 172, a flat surface of hemisphere pad 176 can rotate within conical bearing 178 to make a kinematic full contact with bottom side 112a of mounting pad 112.

Figure 3:
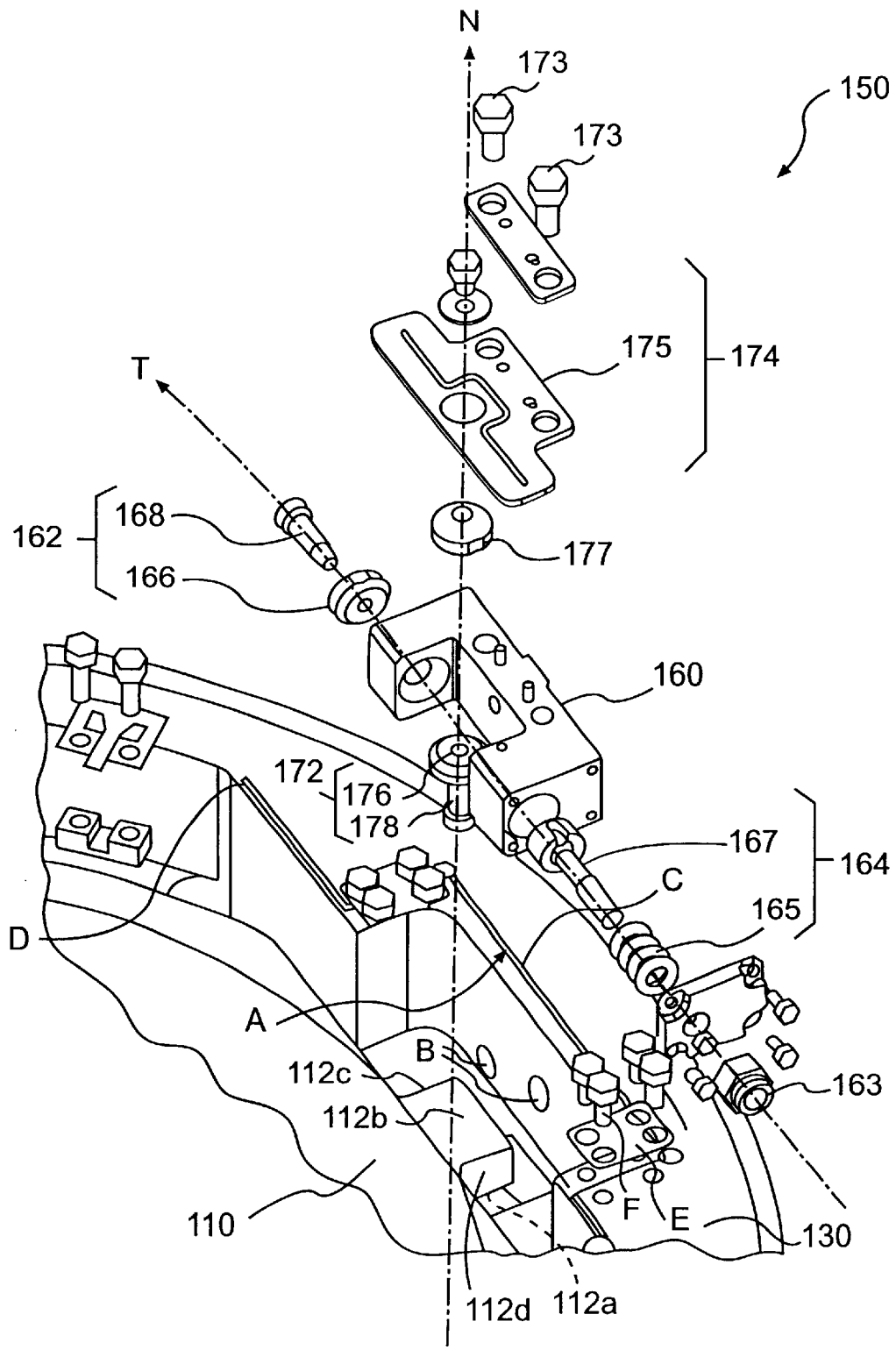
FIG. 3 is an exploded perspective view of the clamping brackets shown in FIG. 1.
Figure 4:
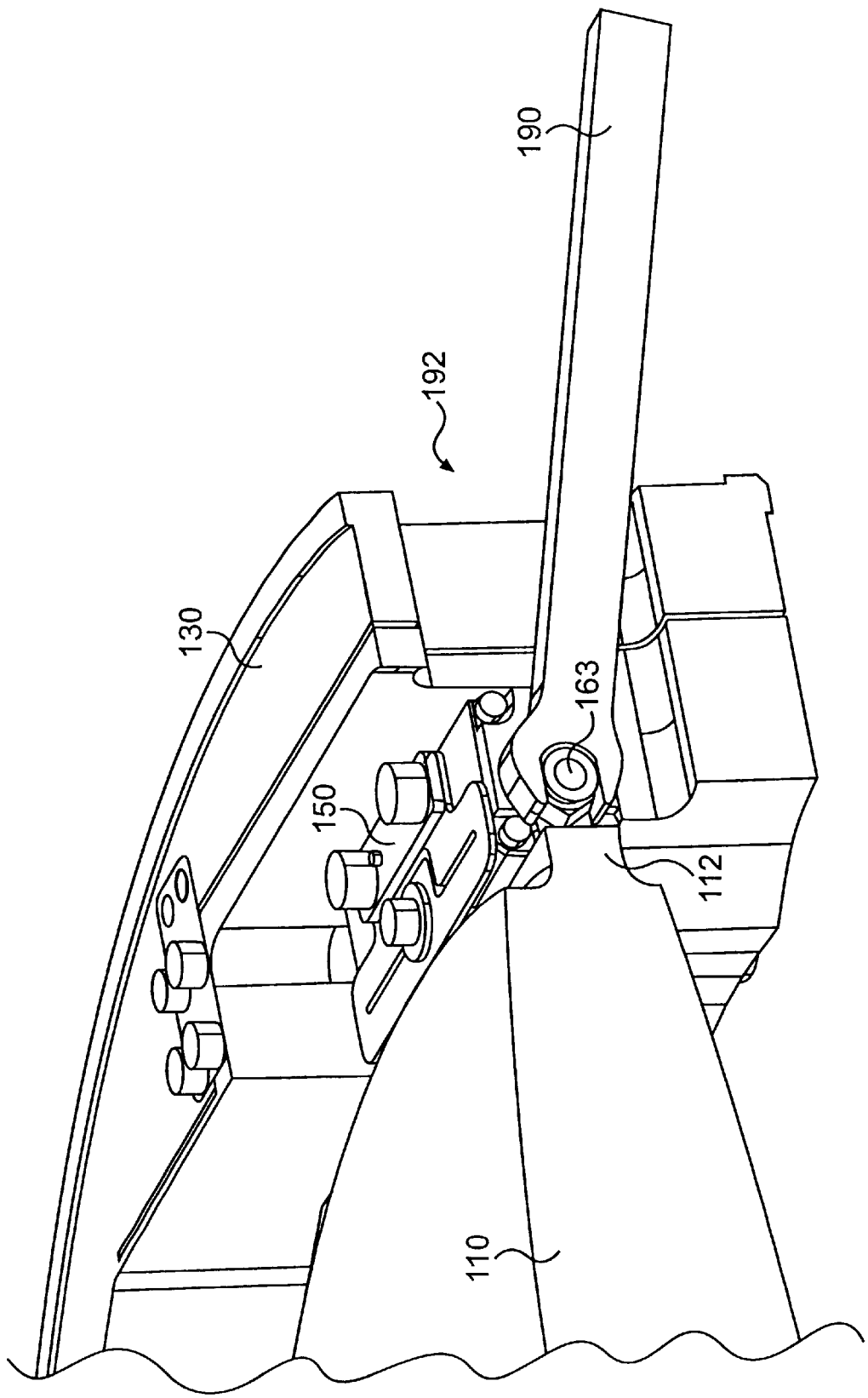
FIG. 4 is a partial perspective view of mounting pad and mounting bracket shown in FIG. 3.

FIG. 3 illustrates in detail the structure of a preferred clamping bracket 150. Clamping brackets 152, 154, and 156 are similarly constructed. Each clamping bracket 150 includes a tangential clamping block 160 for housing fixed stopping pad 162 and flexible stopping pad 164, on opposite side of fixed stopping pad 162 in the tangential direction T. With respect to mounting pad 112, fixed stopping pad 162 provides a physical stop contact against rear side 112c, while flexible stopping pad 164 provides an elastic stop contact adjustable to press front side 112d towards rear side 112c in tangential direction T. In the embodiment shown in FIGS. 1 and 3, fixed stopping pad 162 is constructed of hemisphere pad 166 which is freely rotatable and supported by bearing pad 168, while flexible stopping pad 164 is constructed of spring 165 and contact pad 167. The stiffness of spring 165 can be adjusted to increase or decrease the spring force pressing front side 112d towards rear side 112c. The spring force in turn forces the flat surface of hemisphere pad 166 to rotate around bearing pad 168 and make a kinematic full contact with rear side 112c. As shown in FIG. 4, adjustment can be made by tightening screw 163 using a wrench 190 through one of a plurality of access openings 192 provided on the periphery of lens cell 130 adjacent each of clamping seat areas 132, 134, and 136.

Also illustrated in FIG. 3, clamping bracket 150 includes fixed stopping pad 172 and flexible stopping pad 174, on opposite side of fixed stopping pad 172 in the normal direction N. With respect to mounting pad 112, fixed stopping pad 172 provides a physical stop contact against bottom side 112a, while flexible stopping pad 174 provides an elastic stop contact adjustable to press top side 112b towards bottom side 112a in the normal direction N. Fixed stopping pad 172 may be constructed of hemisphere pad 176 which is freely rotatable and supported by bearing pad 178, while flexible stopping pad 174 is constructed of spring or flexure 175 and contact pad 177. The stiffness of spring 175 can be adjusted to increase or decrease the spring force pressing top side 112b towards bottom side 112a. The spring force in turn forces the flat surface of hemisphere pad 176 to rotate around bearing pad 178 and make a kinematic full contact with bottom side 112a. Adjustment can be made by tightening screws 173. Screws 173 may have a knurled head for manual adjustment or a hexagonal head, for example, for adjustment using a wrench (not shown).

Lens cell 130 has lens 110 and a plurality of radially formed radial flexure mounts A. In this embodiment, each radial fixture mount A includes a set of three flexing segments disposed around the area indicated by outline E.

In the middle of radial flexure mount A, an attachment part B for clamping bracket 150 is formed. Radial flexure mount A is separated by a flexure slot C formed on lens cell 130 and attached to lens cell 130 via flexure slots D located on both radial sides of slot C. Flexure slots C and D can be formed by applying wire electric machining process to lens cell 130. By attaching clamping bracket 150 to the middle of radial flexure mount A, the difference between the expansion rate of lens 110 and lens cell 130 can be accommodated when the lens 110 and lens cell 130 have different coefficients of thermal expansion or expansion rates. Radial flexure mount A has no ductility in the radial direction and high ductility in the tangent and optical axis directions. Therefore, by attaching lens 110 to radial flexure mount A via clamping bracket 150, the expansion difference between lens 110 and lens cell 130 due to the change in temperature can be accommodated and distortions of lens 110 can be minimized.

In order to prevent a mechanical stress to the flexing segments of radial flexure mount A when clamping bracket 150 is attached to the radial flexure mount, an attachment mechanism to attach radial flexure mount A and lens cell 130 is provided. This mechanism includes a plate member E for securing radial flexure mount A and lens cell 130, and is attached by at least one screw or pin via plate member E. This attachment mechanism may be removed after lens cell assembly 100 is constructed.

Figure 5:
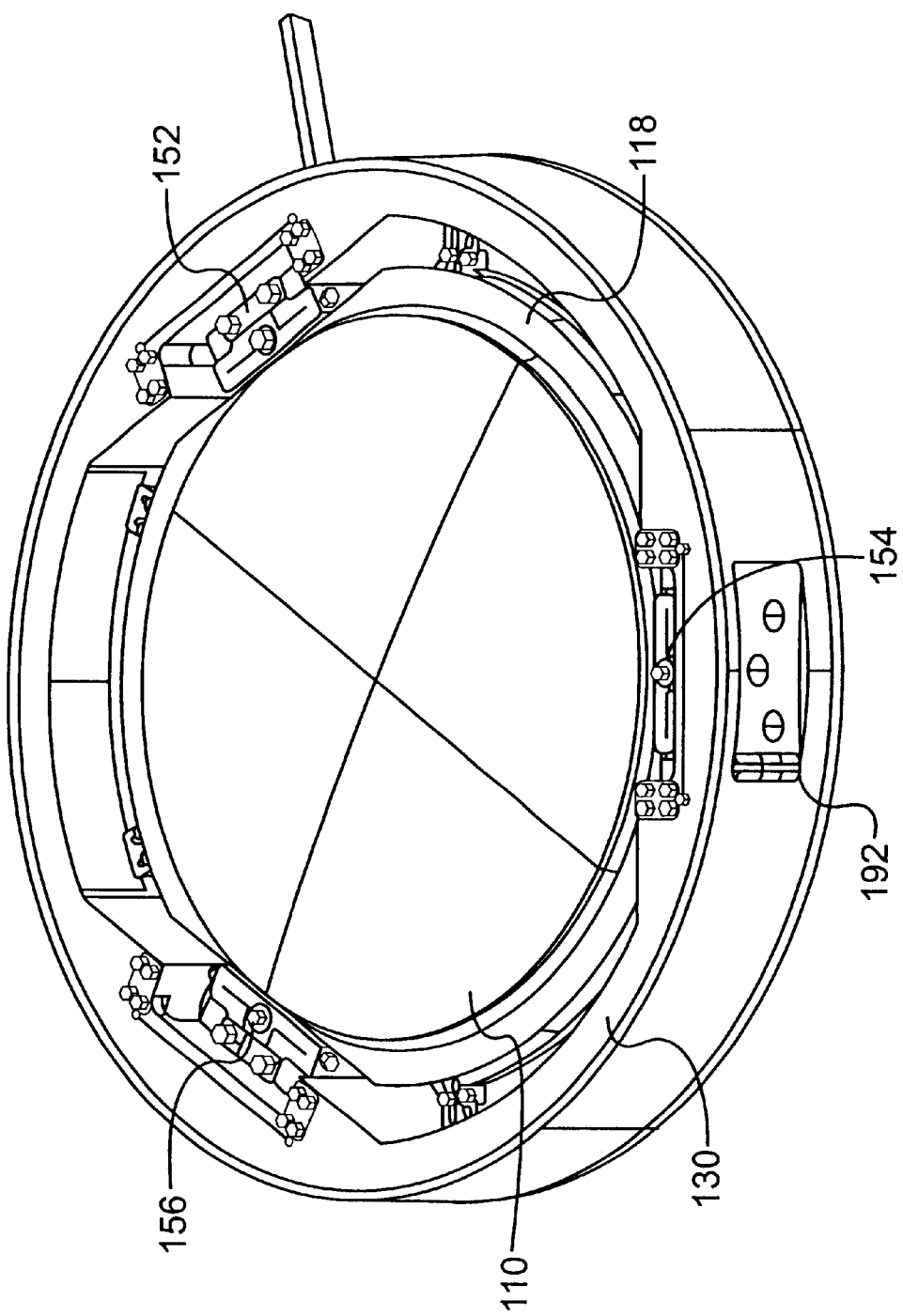
FIG. 5 is a perspective view of a fully assembled optical mounting assembly consistent with the principles of the present invention.
Figure 6:
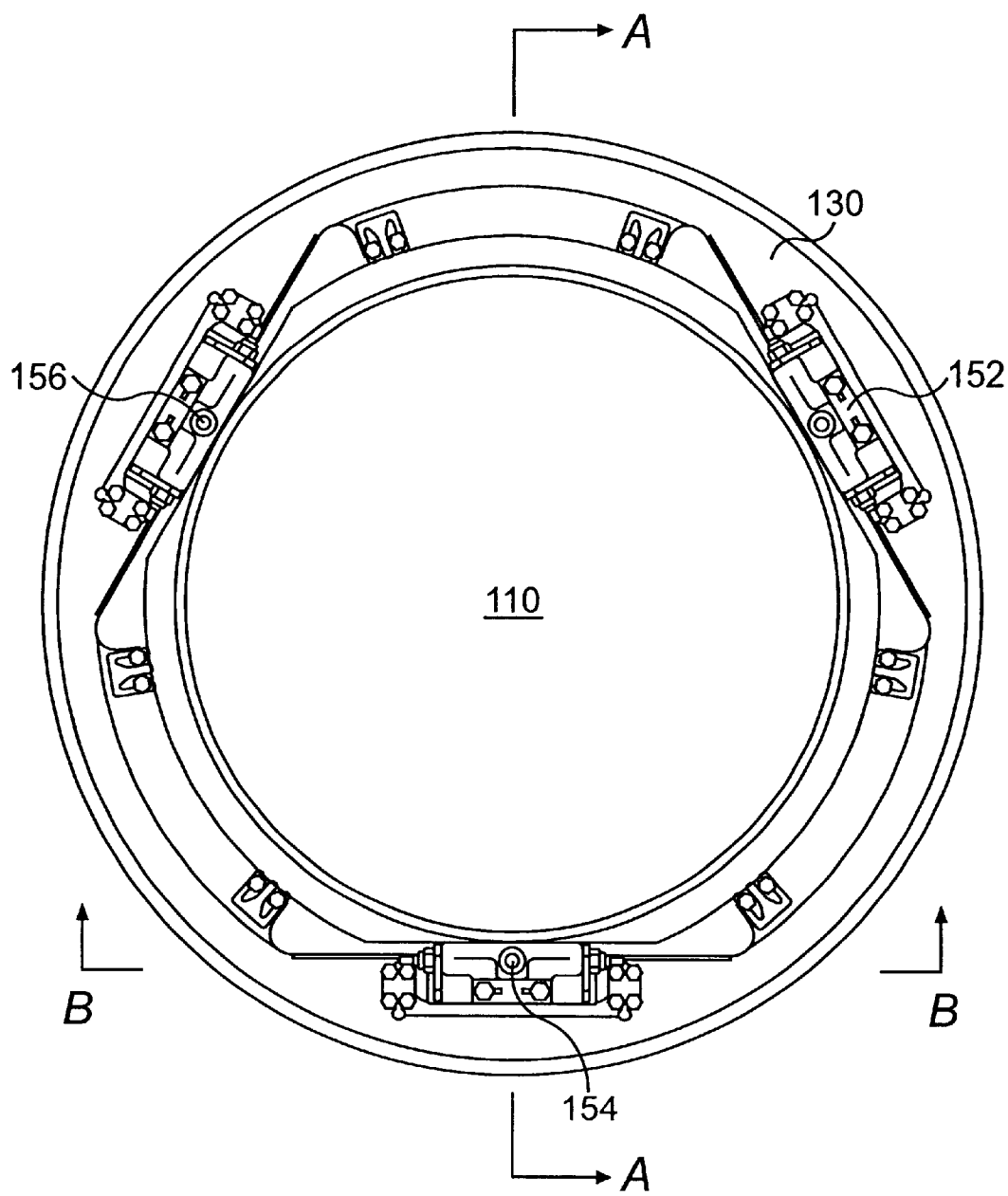
FIG. 6 is a top view of the optical mounting assembly shown in FIG. 5.
Figure 6A:
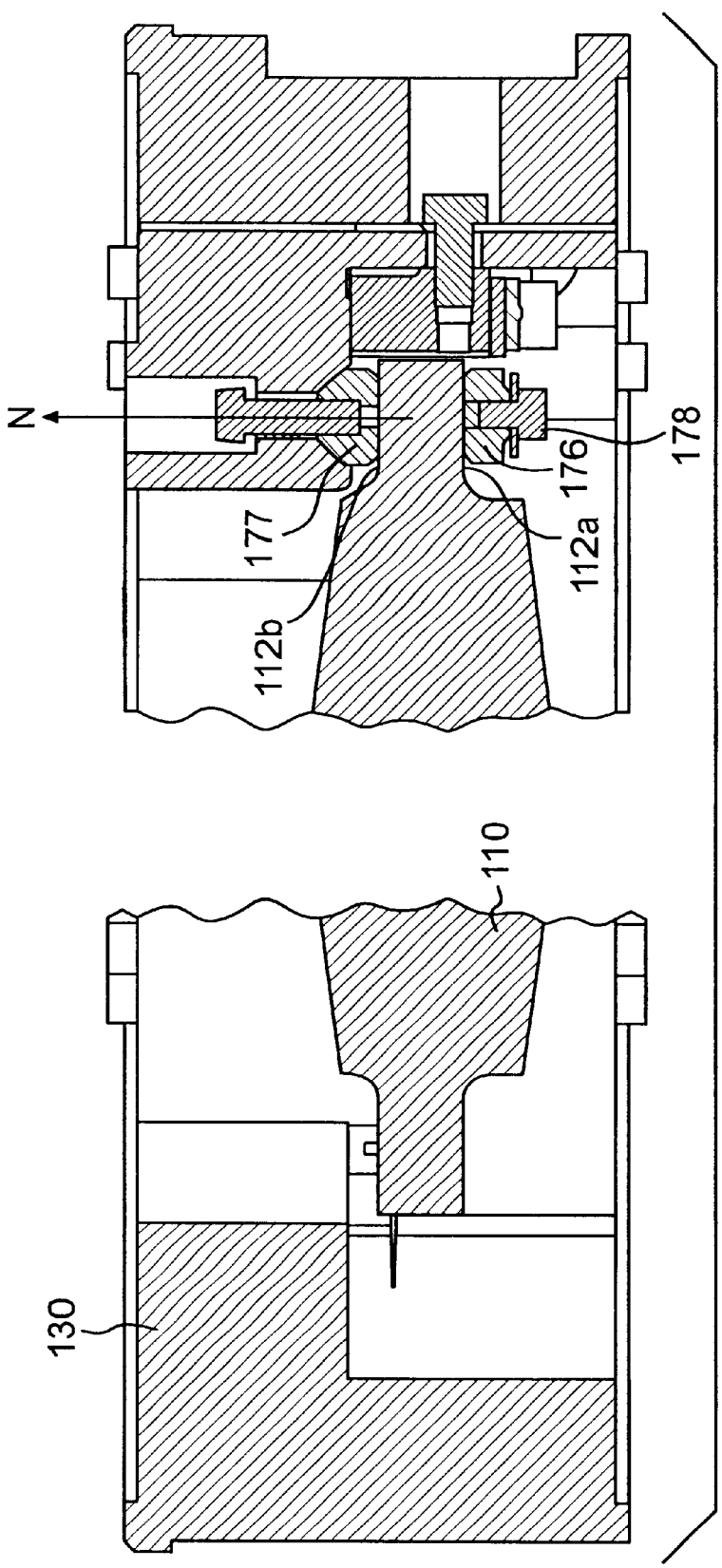
FIG. 6A is a sectional view of the optical mounting assembly taken from line A—A of FIG. 6.
Figure 6B:
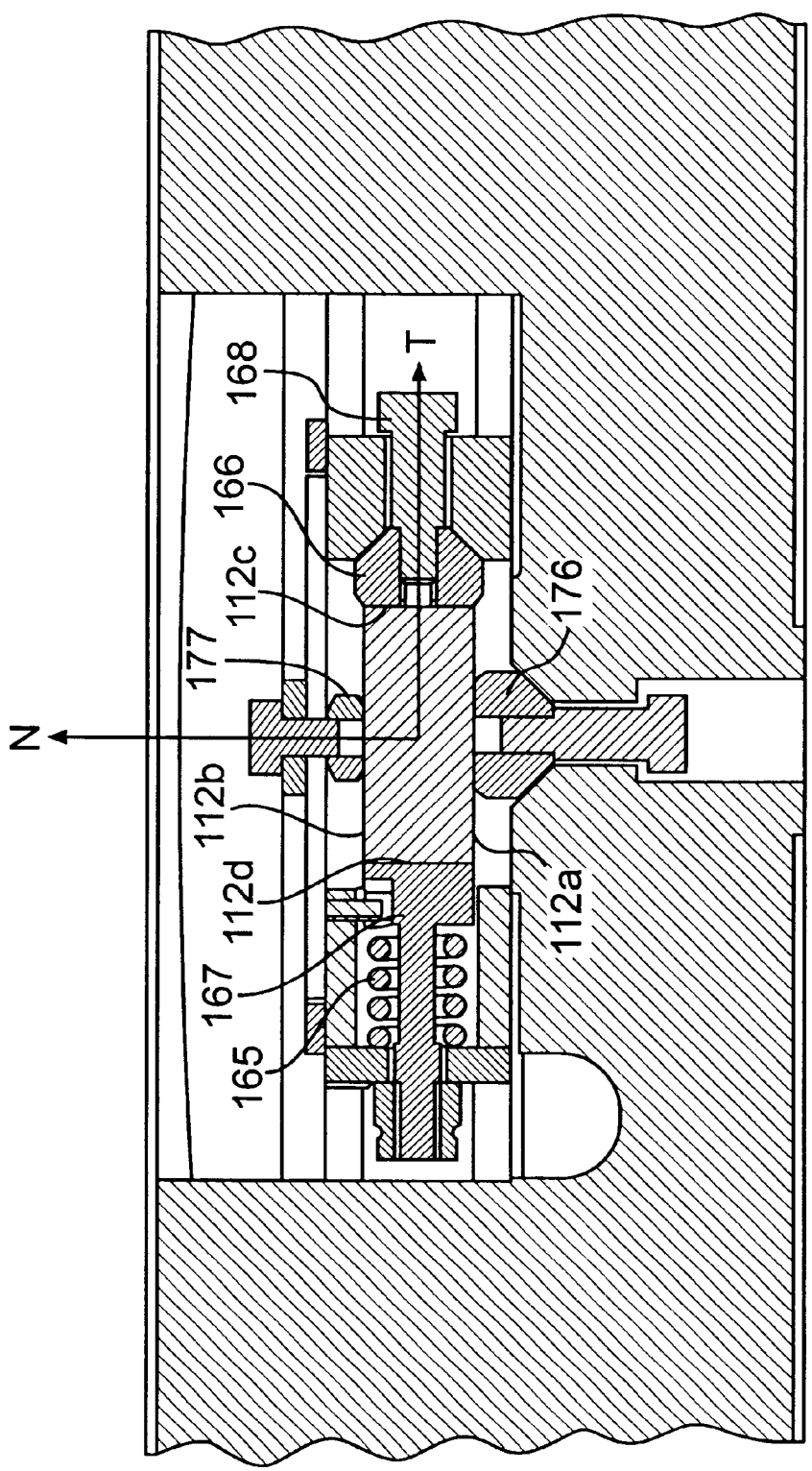
FIG. 6B is a sectional view of the optical mounting assembly taken from line B—B of FIG. 6.

FIGS. 5 and 6 are perspective and top views, respectively, showing the fully assembled lens cell assembly 100. FIGS. 6A and 6B show section views of lens cell assembly 100 taken from line A—A and B—B, respectively, of FIG. 6 to illustrate clamping bracket 150 providing the kinematic mounting assembly.

Figure 7:
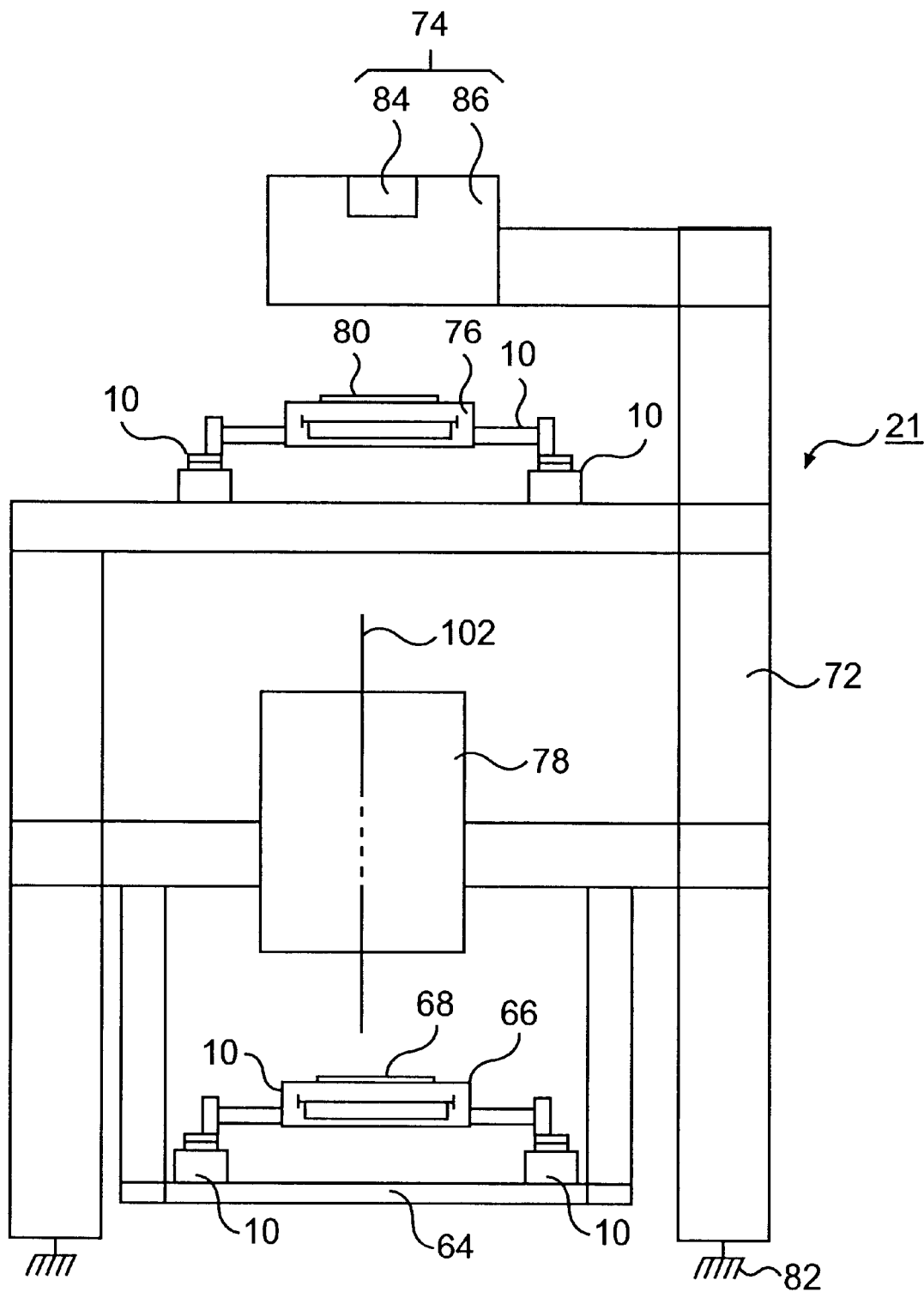
FIG. 7 is an elevation view of an exposure apparatus in which the optical mounting assembly consistent with the principles of this invention can be utilized.

Lens cell assembly 100 is particularly useful in combination with an exposure apparatus 21 in a photolithography process. In operation, exposure apparatus 21, such as shown in FIG. 7, transfers a pattern of an integrated circuit from reticle 80 onto semiconductor wafer 68. Exposure apparatus 21 mounts to a base 82, i.e., a floor or the ground or some other supporting structure.

Apparatus frame 72 is rigid and supports the components of exposure apparatus 21. The design of apparatus frame 72 may vary to suit the design requirements for the rest of exposure apparatus 21. Apparatus frame 72 supports reticle stage 76, wafer stage 66, lens assembly 78, and illumination system 74 above base 64. Alternatively, for example, separate, individual structures (not shown) can be used to support wafer stage 66 and reticle stage 76, illumination system 74, and lens assembly 78 above base 64.

Illumination system 74 includes an illumination source 84 and an illumination optical assembly 86. Illumination source 84 emits the beam (irradiation) of light energy. Illumination optical assembly 86 guides the beam of light energy from illumination source 84 to lens assembly 78. The beam illuminates selectively different portions of reticle 80 and exposes wafer 68. In FIG. 7, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 80 to wafer 68. Depending upon the design of apparatus 21, lens assembly 78 can magnify or reduce the image illuminated on reticle 80. Lens assembly 78 can also be a 1× magnification system.

Wafer stage 66 is stabilized so that the leveling shift problem and the rotational problem are substantially reduced as previously discussed in detail. The principles of the present invention also apply to reticle stage 76 in positioning reticle 80.

Reticle stage 76 holds and precisely positions reticle 80 relative to lens assembly 78 and wafer 68. Somewhat similarly, wafer stage 66 holds and positions wafer 68 with respect to the projected image of the illuminated portions of reticle 80. In the embodiment illustrated in FIG. 7, wafer stage 66 and reticle stage 76 are positioned by a plurality of motors 10. Depending upon the design, apparatus 21 can also include additional servo drive units, linear motors and planar motors to move wafer stage 66 and reticle stage 76.

There are several different types of photolithographic devices. For example, exposure apparatus 21 can be used as a scanning type photolithography system which exposes the pattern from reticle 80 onto wafer 68 with reticle 80 and wafer 68 moving synchronously. In a scanning type lithographic device, reticle 80 is moved perpendicular to an optical axis of lens assembly 78 by reticle stage 76 and wafer 68 is moved perpendicular to an optical axis of lens assembly 78 by wafer stage 66. Scanning of reticle 80 and wafer 68 occurs while reticle 80 and wafer 68 are moving synchronously.

Alternatively, exposure apparatus 21 can be a step-and-repeat type photolithography system that exposes reticle 80 while reticle 80 and wafer 68 are stationary. In the step and repeat process, wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68 so that the next field of semiconductor wafer 68 is brought into position relative to lens assembly 78 and reticle 80.

However, the use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 8:
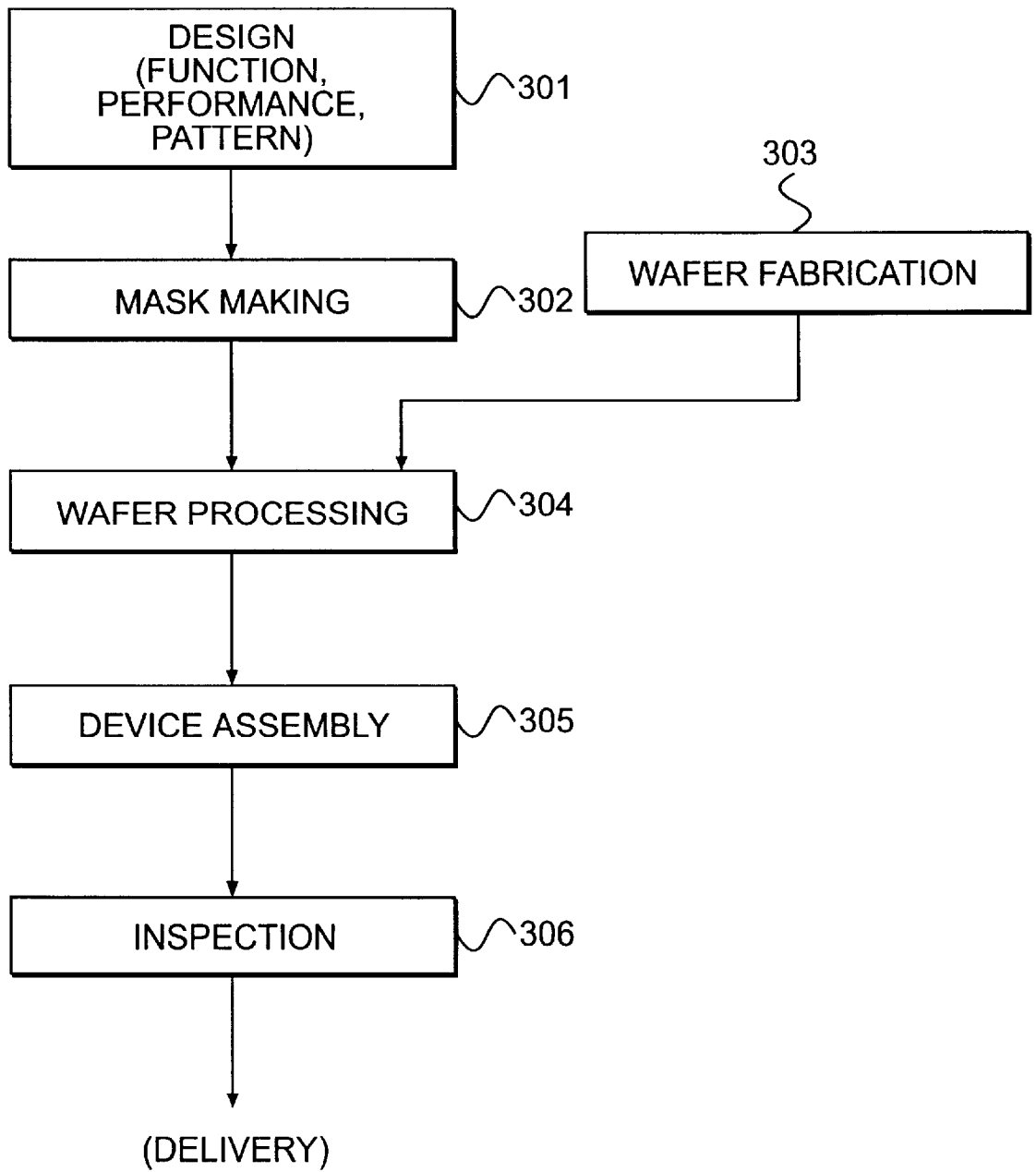
FIG. 8 is a flow chart outlining a process for manufacturing a semiconductor wafer consistent with the principles of the present invention.

Further, semiconductor devices can be fabricated using the above described systems, by the process shown generally in FIG. 8. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 9:
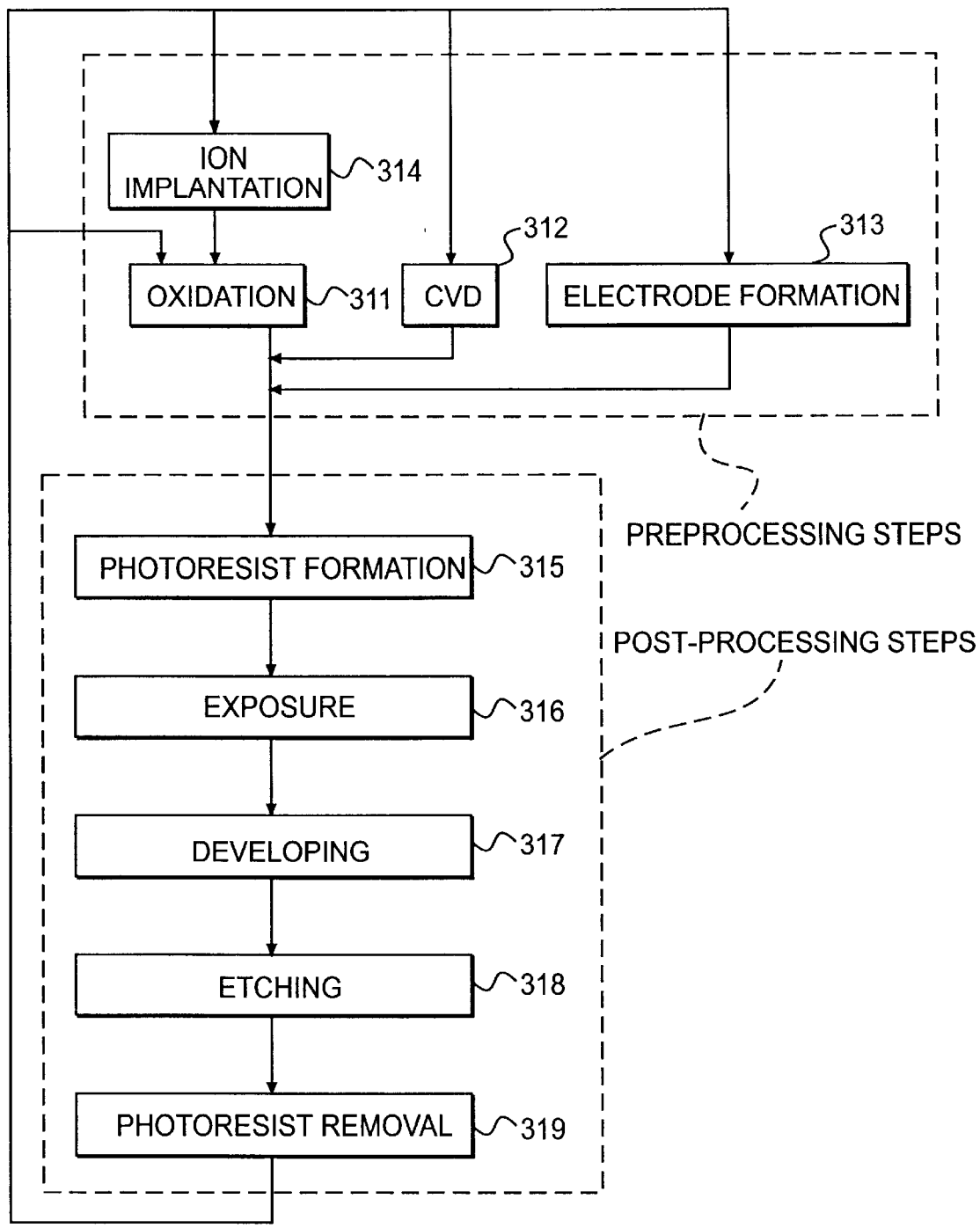
FIG. 9 is a flow chart outlining the semiconductor manufacturing process in more detail.

FIG. 9 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the lens cell assembly and the methods described, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. An optical mounting assembly, comprising:

an optical element, having an optical axis, an outer circumference, and a plurality of mounting pads distributed substantially equi-angularly around the outer circumference; and an optical holder having an inner circumference and a corresponding plurality of clamping brackets distributed around the inner circumference, the optical holder supporting the optical element at points of contact between the plurality of mounting pads and the corresponding plurality of clamping brackets.

2. The optical mounting assembly of claim 1, wherein each of the plurality of clamping brackets comprises:

a fixed constraining element supporting a first side of the corresponding mounting pad in a normal direction parallel to the optical axis of the optical element; and a flexible constraining element supporting a second side, opposite the first side, of the corresponding mounting pad in the normal direction.

3. The optical mounting assembly of claim 2, wherein the fixed constraining element in the normal direction is a hemisphere pad freely rotatable on a bearing, a flat surface of the hemisphere pad supporting the first side of the corresponding mounting pad.

4. The optical mounting assembly of claim 2, wherein the flexible constraining element in the normal direction is a spring compressible to generate a force to press the second side of the corresponding mounting pad against the first side.

5. The optical mounting assembly of claim 1, wherein each of the plurality of clamping brackets comprises:

a fixed constraining element supporting a third side of the corresponding mounting pad in a tangential direction of the optical element at the corresponding mounting pad; and a flexible constraining element supporting a fourth side, opposite the third side, of the corresponding mounting pad in the tangential direction.

6. The optical mounting assembly of claim 5, wherein the fixed constraining element in the tangential direction is a hemisphere pad freely rotatable on a bearing, a flat surface of the hemisphere pad supporting the third side of the corresponding mounting pad.

7. The optical mounting assembly of claim 5, wherein the flexible constraining element in the tangential direction is a spring compressible to generate a force to press the fourth side of the corresponding mounting pad against the third side.

8. The optical mounting assembly of claim 1, wherein the plurality of mounting pads are three mounting pads and the corresponding plurality of clamping brackets are three clamping brackets.

9. An object on which an image has been formed by the optical mounting assembly of claim 1.

10. A projection lens assembly comprising the optical mounting assembly of claim 1.

11. A lithography system comprising the optical mounting assembly of claim 1.

12. An optical mounting assembly, comprising:

an optical element having an optical axis; and an optical holder supporting the optical element at three points of contact distributed substantially equi-angularly around the optical holder;

wherein the optical element is constrained by the optical holder in six degrees of freedom at the three points of contact, three degrees of freedom in a normal direction parallel to the optical axis, and another three degrees of freedom in a tangential direction of the optical holder at the corresponding three points of contact.

13. The optical mounting assembly of claim 12, further comprising:

three fixed constraining elements in the normal direction, each fixedly supporting a first side of the corresponding point of contact in the normal direction; and three flexible constraining elements in the normal direction, each flexibly supporting a second side, opposite the first side, of the corresponding point of contact, wherein the three degrees of freedom in the normal direction are obtained from pairings of the three fixed constraining elements and the three flexible constraining elements in the normal direction.

14. The optical mounting assembly of claim 13, wherein each of the three fixed constraining elements in the normal direction is a hemisphere pad freely rotatable on a bearing, a flat surface of the hemisphere pad supporting the first side of the corresponding mounting pad.

15. The optical mounting assembly of claim 13, wherein each of the three flexible constraining elements in the normal direction is a spring compressible to generate a force to press the second side of the corresponding mounting pad against the first side.

16. The optical mounting assembly of claim 12, further comprising:

three fixed constraining elements in the tangential direction, each fixedly supporting a third side of the corresponding point of contact in the tangential direction of the corresponding point of contact; and three flexible constraining elements in the tangential direction, each flexibly supporting a fourth side, opposite the third side, of the corresponding point of contact, wherein the three degrees of freedom in the tangential direction are obtained from pairings of the three fixed constraining elements and the three flexible constraining elements in the tangential direction.

17. The optical mounting assembly of claim 16, wherein each of the three fixed constraining elements in the tangential direction is a hemisphere pad freely rotatable on a bearing, a flat surface of the hemisphere pad supporting the third side of the corresponding mounting pad.

18. The optical mounting assembly of claim 16, wherein each of the three flexible constraining elements in the tangential direction is a spring compressible to generate a force to press the fourth side of the corresponding mounting pad against the third side.

19. An object on which an image has been formed by the optical mounting assembly of claim 12.

20. A projection lens assembly comprising the optical mounting assembly of claim 12.

21. A lithography system comprising the optical mounting assembly of claim 12.

22. A method for making an optical mounting assembly having an optical element and an optical holder supporting the optical element, the method comprising the steps of:

forming a plurality of mounting pads distributed substantially equi-angularly around an outer circumference of the optical element; and supporting the plurality of mounting pads to a corresponding plurality of clamping brackets distributed around an inner circumference of the optical holder for supporting the optical element at points of contact between the plurality of mounting pads on the optical element and the corresponding plurality of clamping brackets on the optical holder.

23. The method of claim 22, wherein the supporting step further comprises:

fixedly constraining a first side of each of the plurality of mounting pads in a normal direction parallel to an optical axis of the optical element; and flexibly constraining a second side, opposite the first side, of each of the plurality of mounting pads.

24. The method of claim 22, wherein the supporting step further comprises:

fixedly constraining a third side of each of the plurality of mounting pads in a tangential direction of the optical element at the corresponding mounting pad; and flexibly constraining a fourth side, opposite the third side, of the corresponding mounting pad.

25. An object on which an image has been formed according to the method for making an optical mounting assembly of claim 22.

26. A lithography system utilizing a method for making an optical mounting assembly of claim 22.

27. A method for supporting an optical element in an optical mounting assembly, the optical mounting assembly having an optical holder for supporting the optical element and having an optical axis, the method comprising the steps of:

providing three points of contact distributed substantially equi-angularly between an inner circumference of the optical holder and an outer circumference of the optical element constraining the optical element to the optical holder in three degrees of freedom in a normal direction parallel to the optical axis at the corresponding three points of contact; and constraining the optical element to the optical holder in three degrees of freedom in a tangential direction of the optical holder at the corresponding three points of contact.

28. The method of claim 27, wherein the step of constraining in the normal direction further comprises:

fixedly constraining a first side of each of the corresponding three points of contact in the normal direction; and flexibly constraining a second side, opposite the first side, of the corresponding point of contact.

29. The method of claim 27, wherein the step of constraining in a tangential direction of the optical holder further comprises:

fixedly constraining a third side of each of the corresponding three points of contact in the tangential direction; and flexibly constraining a fourth side, opposite the third side, of each of the corresponding three points of contact.

30. An object on which an image has been formed according to the method for supporting an optical element of claim 27.

31. A lithography system utilizing a method for supporting an optical element of claim 27.

32. An optical mounting assembly for kinematically mounting an optical element having an optical axis and a plurality of mounting pads along its periphery, the assembly comprising:

an optical holder having a central opening;

a plurality of brackets disposed on the optical holder adjacent to the central opening adapted to engage respective mounting pads, each bracket comprising:

an axial clamping element adapted to engage a first pair of opposing surfaces of a respective mounting pad to restrain motion of the mounting pad relative to the optical holder in a direction substantially parallel to the optical axis; and a tangential clamping element adapted to engage a second pair of opposing surfaces of the respective mounting pad to restrain motion of the mounting pad relative to the optical holder in a direction substantially tangential to the optical element.

33. The optical mounting assembly of claim 32, wherein the axial clamping element comprises:

a fixed constraining element, comprising:

a hemisphere pad having a substantially flat contact surface adapted to engage a surface of the respective mounting pad and a hemispherical bearing surface rotatably supported by a conical bearing element; and a flexible constraining element, comprising:

a contact pad having a substantially flat contact surface adapted to engage an opposing surface of the respective mounting pad; and a spring biasing the contact pad towards the respective mounting pad.

34. The optical mounting assembly of claim 33, wherein the spring is a leaf spring.

35. The optical mounting assembly of claim 32, wherein the tangential clamping element comprises:

a fixed constraining element, comprising:

a hemisphere pad having a substantially flat contact surface adapted to engage a surface of the respective mounting pad and a hemispherical bearing surface rotatably supported by a conical bearing element; and a flexible constraining element, comprising:

a contact pad having a substantially flat contact surface adapted to engage an opposing surface of the respective mounting pad; and a spring biasing the contact pad towards the respective mounting pad.

36. The optical mounting assembly of claim 35, further comprising:

an adjusting device connected with the spring to adjust a biasing force of the spring.

37. The optical mounting assembly of claim 36, wherein the spring is a coil spring.

38. The optical mounting assembly of claim 32, further comprising:

a plurality of retainer clips disposed on the optical holder at locations between the brackets adapted to support the optical element along its periphery.

39. The optical mounting assembly of claim 32, wherein the plurality of brackets are three brackets.

40. The optical mounting assembly of claim 39, wherein the three brackets are adapted to constrain the motion of the optical element in six degrees of freedom.

* * * * *